(12) United States Patent
Dornisch et al.

(10) Patent No.: US 6,885,056 B1
(45) Date of Patent: Apr. 26, 2005

(54) HIGH-K DIELECTRIC STACK IN A MIM CAPACITOR AND METHOD FOR ITS FABRICATION

(75) Inventors: Dieter Dornisch, Carlsbad, CA (US); David J Howard, Irvine, CA (US); Abhijit B Joshi, Ladera Ranch, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/692,431

(22) Filed: Oct. 22, 2003

(51) Int. Cl.[7] .................... H01L 27/108; H01L 29/76; H01L 29/94; H01L 31/119
(52) U.S. Cl. .................... 257/310; 257/303; 257/304; 257/311; 438/239; 438/240; 438/253
(58) Field of Search .................... 257/303, 304, 257/310, 311; 438/239, 240, 253

(56) References Cited

U.S. PATENT DOCUMENTS

| | | | | |
|---|---|---|---|---|
| 6,048,766 A | * | 4/2000 | Gardner et al. | 438/257 |
| 6,156,600 A | * | 12/2000 | Chao et al. | 438/238 |
| 6,495,878 B1 | * | 12/2002 | Hayashi et al. | 257/310 |
| 6,639,267 B2 | * | 10/2003 | Eldridge | 257/310 |
| 6,693,321 B1 | * | 2/2004 | Zheng et al. | 257/314 |

OTHER PUBLICATIONS

Won, et al., "Novel Plasma Enhanced Atomic Layer Deposition Technology for High–k Capacitor with EOT of 8Å on Conventional Metal Electrode"; 2003 Symposium on VLSI Technology Digest of Technical Papers, 4–89114–035–6/03.
Hu et al., "High Performance ALD $HfO_2$–$Al_2O_3$ Laminate MIM Capacitors for RF and Mixed Signal IC Applications," ISBN 0–7803–7873–3, IEEE, 2003.

\* cited by examiner

*Primary Examiner*—George Eckert
*Assistant Examiner*—Edgardo Ortiz
(74) *Attorney, Agent, or Firm*—Farjami & Farjami LLP

(57) ABSTRACT

According to one exemplary embodiment, a high-k dielectric stack situated between upper and lower electrodes of a MIM capacitor comprises a first high-k dielectric layer, where the first high-k dielectric layer has a first dielectric constant. The high-k dielectric stack further comprises an intermediate dielectric layer situated on the first high-k dielectric layer, where the intermediate dielectric layer has a second dielectric constant. According to this exemplary embodiment, the high-k dielectric stack further comprises a second high-k dielectric layer situated on the intermediate dielectric layer, where the second high-k dielectric layer has a third dielectric constant. The second dielectric constant can be lower than the first dielectric constant and the third dielectric constant. The high-k dielectric stack further comprises first and second cladding layers, where the first cladding layer is situated underneath the first high-k dielectric layer and the second cladding layer is situated on the second high-k dielectric layer.

20 Claims, 3 Drawing Sheets

HIGH-K DIELECTRIC STACK IN A MIM CAPACITOR AND METHOD FOR ITS FABRICATION

BACKGROUND OF THE INVENTION

1. Field of the Invention

The present invention is generally in the field of semiconductor fabrication. More specifically, the invention is in the field of fabrication of capacitors in semiconductor dies.

2. Related Art

High performance mixed signal and RF circuits require high density integrated capacitors. Metal-insulator-metal ("MIM") capacitors can be considered for use in the fabrication of integrated mixed signal and RF circuits on semiconductor dies. In an effort to increase the capacitance density of MIM capacitors, dielectrics having a high dielectric constant ("high-k") have been utilized in MIM capacitors. However, high-k dielectrics, such as tantalum oxide ("$Ta_2O_5$") or hafnium oxide ("$HfO_2$"), also tend to exhibit very high leakage current and low breakdown voltage.

In one approach to solving the problems of high leakage current and low breakdown voltage, a dielectric stack including a high-k dielectric layer situated between two cladding layers is utilized in a MIM capacitor. For example, a high-k dielectric such as $Ta_2O_5$, which has a dielectric constant ("k") equal to approximately 25, can be situated between cladding layers comprising aluminum oxide ("$Al_2O_3$"), which has a k equal to approximately 9. The dielectric stack in the above approach achieves some reduction in leakage current and increased breakdown voltage compared to a MIM capacitor comprising a single high-k dielectric layer in a MIM capacitor.

Thus, there is a need in the art for a MIM capacitor dielectric having reduced leakage current and increased breakdown voltage.

SUMMARY OF THE INVENTION

The present invention is directed to a high-k dielectric stack in a MIM capacitor and method for its fabrication. The present invention addresses and resolves the need in the art for a MIM capacitor dielectric having reduced leakage current and increased breakdown voltage.

According to one exemplary embodiment, a high-k dielectric stack situated between upper and lower electrodes of a MIM capacitor comprises a first high-k dielectric layer, where the first high-k dielectric layer has a first dielectric constant. The high-k dielectric stack further comprises an intermediate dielectric layer situated on the first high-k dielectric layer, where the intermediate dielectric layer has a second dielectric constant. The intermediate dielectric layer may be $Al_2O_3$, for example. The intermediate dielectric layer can have a thickness, for example, between approximately 5.0 Angstroms and approximately 70.0 Angstroms.

According to this exemplary embodiment, the high-k dielectric stack further comprises a second high-k dielectric layer situated on the intermediate dielectric layer, where the second high-k dielectric layer has a third dielectric constant. In one embodiment, the second dielectric constant is not greater than the first dielectric constant and the third dielectric constant. The high-k dielectric stack further comprises first and second cladding layers, where the first cladding layer is situated underneath the first high-k dielectric layer and the second cladding layer is situated above the second high-k dielectric layer. The first cladding layer can be situated over the lower electrode and the second cladding layer can be situated underneath the upper electrode. The lower and upper electrodes can be Ti/TiN, for example. In another embodiment, the present invention is a method that achieves the above-described high-k dielectric stack. Other features and advantages of the present invention will become more readily apparent to those of ordinary skill in the art after reviewing the following detailed description and accompanying drawings.

DETAILED DESCRIPTION OF THE INVENTION

The present invention is directed to a high-k dielectric stack in a MIM capacitor and method for its fabrication. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
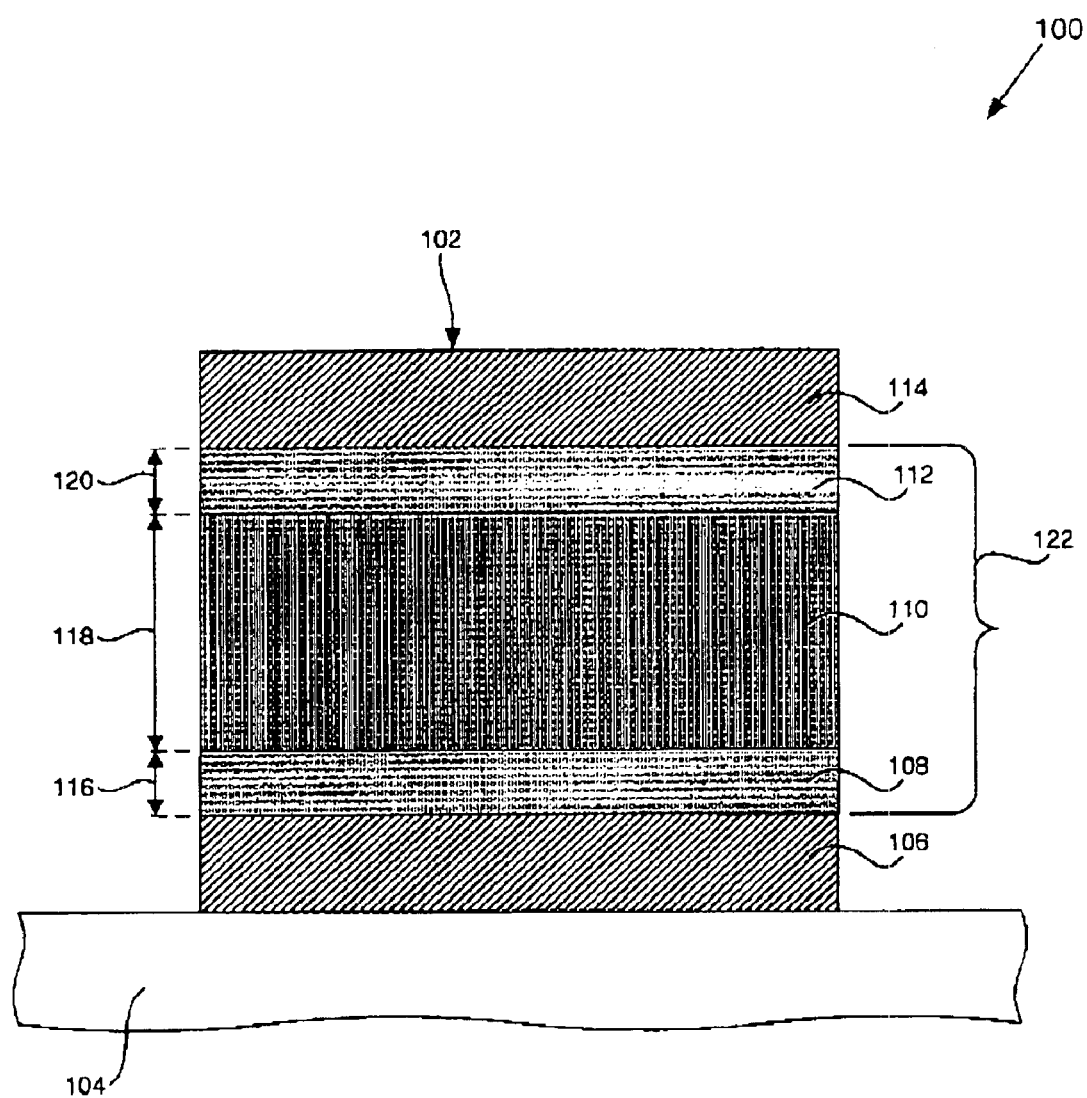
FIG. 1 illustrates a cross sectional view of a structure including a conventional exemplary MIM capacitor.

FIG. 1 shows a cross-sectional view of a portion of a semiconductor die including a conventional exemplary MIM capacitor. As shown in FIG. 1, structure 100 includes conventional MIM capacitor 102 situated on dielectric layer 104, which can be situated over an interconnect metal layer (not shown in FIG. 1) or a semiconductor substrate (not shown in FIG. 1) of a semiconductor die. Conventional MIM capacitor 102 includes metal plates 106 and 114 and conventional dielectric stack 122, which includes cladding layers 108 and 112, and high-k dielectric layer 110. Metal plates 106 and 114 form lower and upper electrodes, respectively, of conventional MIM capacitor 102.

Also shown in FIG. 1, metal plate 106 is situated on dielectric layer 104 and can comprise titanium nitride ("TiN") or other appropriate metal compound or metal. Metal plate 106 can be formed, for example, by depositing and patterning a layer of TiN in a manner known in the art. Further shown in FIG. 1, cladding layer 108 is situated on metal plate 106 and can comprise $Al_2O_3$, which has a k, i.e. a dielectric constant, equal to approximately 9. Cladding layer 108 can be formed by depositing and patterning a layer of $Al_2O_3$ on metal plate 106. By way of example, thickness 116 of cladding layer 108 can be approximately 50.0 Angstroms.

Also shown in FIG. 1, high-k dielectric layer 110 is situated on cladding layer 108 and can comprise a high-k dielectric, such as tantalum oxide ("$Ta_2O_5$") or $HfO_2$. High-k dielectric layer 110 can be formed by depositing and patterning a layer of high-k dielectric material, such as $HfO_2$, on cladding layer 108. By way of example, thickness 118 of high-k dielectric layer 110 can be approximately 200.0 Angstroms. Further shown in FIG. 1, cladding layer 112 is situated on high-k dielectric layer 110 and can be substantially similar in composition and formation to cladding layer 108. By way of example, thickness 120 of cladding layer 112 can also be approximately 50.0 Angstroms. Also shown in FIG. 1, metal plate 114 is situated on cladding layer 112 and can comprise TiN or other appropriate metal compound or metal. Metal plate 114 can be formed by depositing and patterning a layer of an appropriate metal on cladding layer 112 in a manner known in the art.

As discussed above, conventional dielectric stack 122 includes a single high-k dielectric layer, i.e. high-k dielectric layer 110, situated between cladding layers 108 and 112. Assume, for example, that high-k dielectric layer 110 comprises $HfO_2$, has a thickness equal to 200.0 Angstroms, and a k equal to 25, and cladding layers 108 and 112 each comprise $Al_2O_3$, have a thickness equal to 50.0 Angstroms, and a k equal to approximately 9. In the above example, conventional dielectric stack 122 has a thickness equal to 300.0 Angstroms and a breakdown voltage of between 12.5 volts and 13.0 volts.

Figure 2:
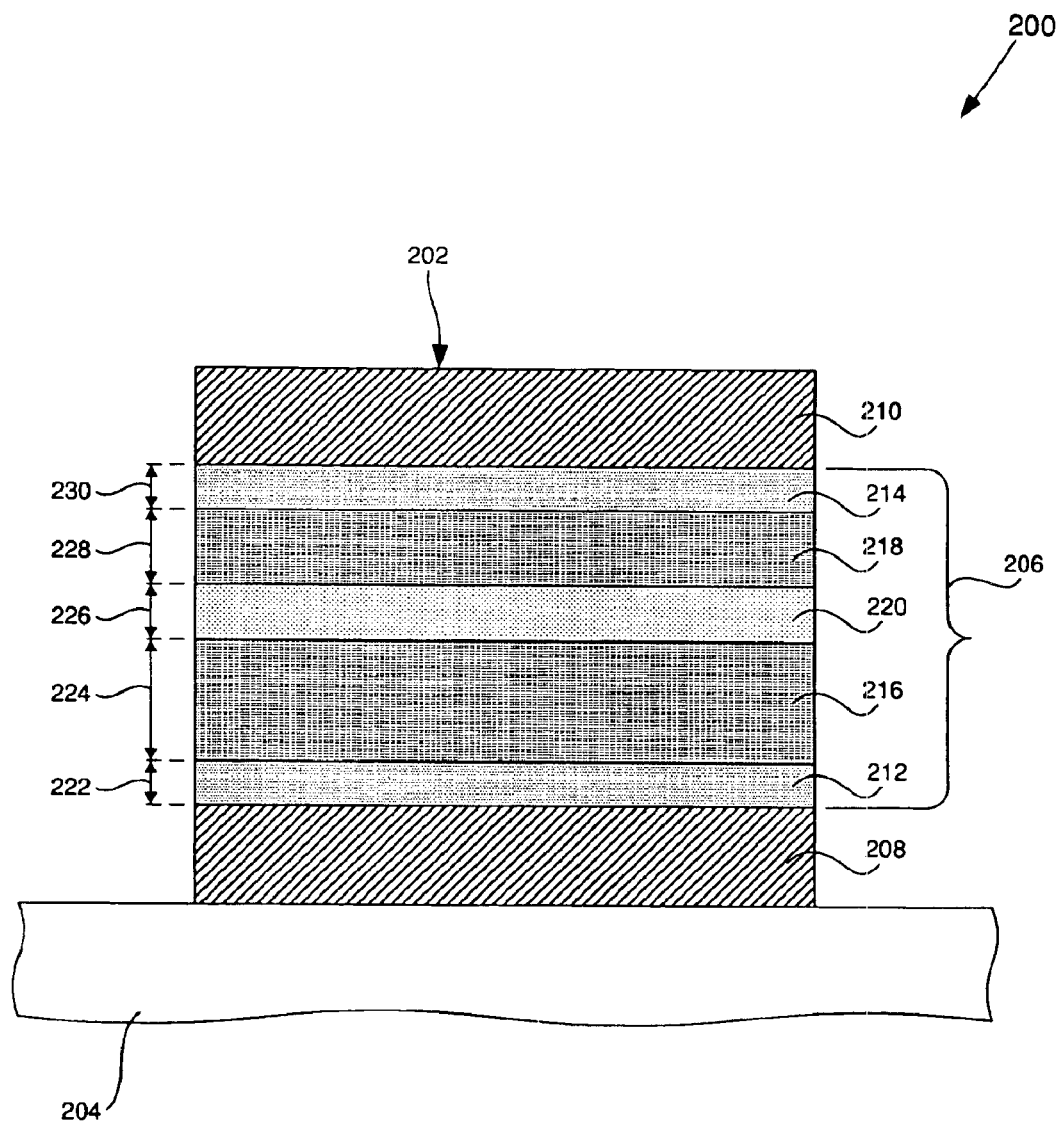
FIG. 2 illustrates a cross sectional view of a structure including an exemplary MIM capacitor in accordance with one embodiment of the present invention.

FIG. 2 shows a cross-sectional view of a portion of a semiconductor die including an exemplary MIM capacitor in accordance with one embodiment of the present invention. Certain details and features have been left out of FIG. 2, which are apparent to a person of ordinary skill in the art. As shown in FIG. 2, structure 200 includes MIM capacitor 202, which is situated on dielectric layer 204. MIM capacitor 202 includes metal plates 208 and 210 and high-k dielectric stack 206, which includes cladding layers 212 and 214, high-k dielectric layers 216 and 218, and intermediate dielectric layer 220. Metal plates 208 and 210 form lower and upper electrodes, respectively, of MIM capacitor 202.

Also shown in FIG. 2, in the present embodiment, metal plate 208 is situated on dielectric layer 204, which can in turn be situated over a semiconductor substrate (not shown in FIG. 2) or an interconnect metal layer (not shown in FIG. 2) of a semiconductor die. Dielectric layer 204 can be, for example, an interlayer dielectric layer and can comprise an appropriate dielectric material. Metal plate 208 can comprise titanium/titanium nitride ("Ti/TiN"), TaN, or other appropriate metal compound or metal. Metal plate 208 can be formed by depositing and patterning a layer of Ti/TiN or other appropriate metal compound or metal on dielectric layer 204 in a manner known in the art. Alternatively, metal plate 208 can be a top metal layer comprising titanium nitride in a "metal stack" having layers of titanium, titanium nitride, aluminum (or copper), and titanium below metal plate 208. In other words, in one embodiment, metal plate 208 comprises titanium nitride and is a top metal in a metal stack of Ti/TiN/Al (or Cu)/Ti/TiN, where the top TiN is metal plate 208. Further shown in FIG. 2, cladding layer 212 is situated on metal plate 208 and can comprise $Al_2O_3$, which has a k value equivalent to approximately 9, or other appropriate dielectric. Cladding layer 212 can be formed by depositing a layer of $Al_2O_3$ on metal plate 208 using a molecular beam epitaxy ("MBE") process or an atomic layer deposition ("ALD") process or other processes. Cladding layer 212 has thickness 222, which can be, for example, approximately 30.0 Angstroms.

Also shown in FIG. 2, high-k dielectric layer 216 is situated on cladding layer 212 and has thickness 224. In the present embodiment, high-k dielectric layer 216 can comprise $HfO_2$, which has a k equal to approximately 25. In other embodiments, high-k dielectric layer 216 can comprise $Ta_2O_5$ or other high-k dielectric. High-k dielectric layer 216 can be formed on cladding layer 212 by using a MBE process or ALD process or other processes. Further shown in FIG. 2, intermediate dielectric layer 220 is situated on high-k dielectric layer 216. In the present embodiment, intermediate dielectric layer 220 can comprise $Al_2O_3$ and can be formed by depositing a layer of $Al_2O_3$ on high-k dielectric layer 216 using a MBE process or ALD process or other processes. In other embodiments, intermediate layer 220 can comprise $Ta_2O_5$, zirconium oxide ("$ZrO_2$"), silicon nitride ("$Si_3N_4$"), silicon dioxide ("$SiO_2$"), or other appropriate dielectric. However, intermediate dielectric layer 220 comprises a different dielectric material than high-k dielectric layers 216 and 218. Thus, for example, in an embodiment of the present invention where intermediate dielectric layer 220 comprises $Ta_2O_5$, high-k dielectric layers 216 and 218 would comprise a dielectric material other than $Ta_2O_5$. In one embodiment, the k, i.e. dielectric constant, of intermediate dielectric layer 220 is lower than the k of high-k dielectric layers 216 and 218. In another embodiment, the k, i.e. dielectric constant, of intermediate dielectric layer 220 can be equal to or higher than the k of high-k dielectric layers 216 and 218. Intermediate dielectric layer 220 has thickness 226, which can be between approximately 5.0 Angstroms and approximately 70.0 Angstroms. In the present embodiment, intermediate dielectric layer 220 is situated at approximately the center of high-k dielectric stack 206. In one embodiment, intermediate dielectric layer 220 may not be situated at the center of high-k dielectric stack 206.

Also shown in FIG. 2, high-k dielectric layer 218 is situated on intermediate dielectric layer 220 and has thickness 228. In the present embodiment, high-k dielectric layer 218 can comprise $HfO_2$, which has a k equal to approximately 25. In other embodiments, high-k dielectric layer 218 can comprise $Ta_2O_5$ or other high-k dielectric. High-k dielectric layer 218 can be formed on intermediate dielectric layer 220 by using a MBE process or ALD process or other processes and has thickness 228. In the present embodiment, thickness 228 of high-k dielectric layer 218 is less than thickness 224 of high-k dielectric layer 216. In one embodiment, thickness 228 of high-k dielectric layer 218 can be greater than thickness 224 of high-k dielectric layer 216. In another embodiment, thickness 228 of high-k dielectric layer 218 can be substantially equal to thickness 224 of high-k dielectric layer 216.

Thus, the present invention achieves a high-k dielectric stack comprising two high-k dielectric layers, i.e. high-k dielectric layers 216 and 218, which are separated by an intermediate dielectric layer, i.e. intermediate dielectric layer 220. In the present invention, intermediate dielectric layer 220 forms interfaces with high-k dielectric layers 216 and 218, which can impede electron current flow between upper and lower electrodes of MIM capacitor 202. As a result, the present invention's high-k dielectric stack achieves reduced leakage current and increased breakdown voltage.

Further shown in FIG. 2, cladding layer 214 is situated on high-k dielectric layer 218 and can comprise $Al_2O_3$ or other appropriate dielectric. Cladding layer 214 can be formed by depositing a layer of $Al_2O_3$ on high-k dielectric layer 218 using a MBE process or an ALD process or other processes. Cladding layer 214 has thickness 230, which can be, for example, approximately 30.0 Angstroms. Also shown in FIG. 2, Metal plate 210 is situated on cladding layer 214 and can comprise Ti/TiN, TaN, or other appropriate metal compound or metal. Metal plate 210 can be formed by depositing and patterning a layer of Ti/TiN or other appropriate metal compound or metal on cladding layer 214.

The following example will be utilized to illustrate the advantages achieved by the present invention's high-k dielectric stack. Assume that cladding layers 212 and 214 each comprise $Al_2O_3$, have a thickness equal to 30.0 Angstroms, and have a k equal to approximately 9, high-k dielectric layers 216 and 218 each comprise $HfO_2$, have a thickness equal to 100.0 Angstroms, and have a k equal to 25, and intermediate dielectric layer 220 comprises $Al_2O_3$, has a thickness equal to 30.0 Angstroms, and has a k equal to approximately 9. In the above example, high-k dielectric stack 206 has a thickness equal to 290.0 Angstroms and a breakdown voltage of approximately 14.5 volts. In contrast, conventional dielectric stack 122 in FIG. 1 has a breakdown voltage between 12.5 volts and 13.0 volts for a comparable thickness of 300.0 Angstroms and a comparable k. Thus, the present invention's high-k dielectric stack advantageously achieves a breakdown voltage that is between 1.5 volts and 2.0 volts higher that conventional dielectric stack 122. Additionally, the present invention's high-k dielectric stack achieves an approximate 5.0% increase in capacitance density and a 3.0% decrease in thickness compared to conventional dielectric stack 122. Furthermore, at an applied MIM capacitor voltage of approximately 13.0, the present invention's high-k dielectric stack advantageously achieves a leakage current that is approximately 10.0 times lower than conventional dielectric stack 122 in FIG. 1.

Figure 3:
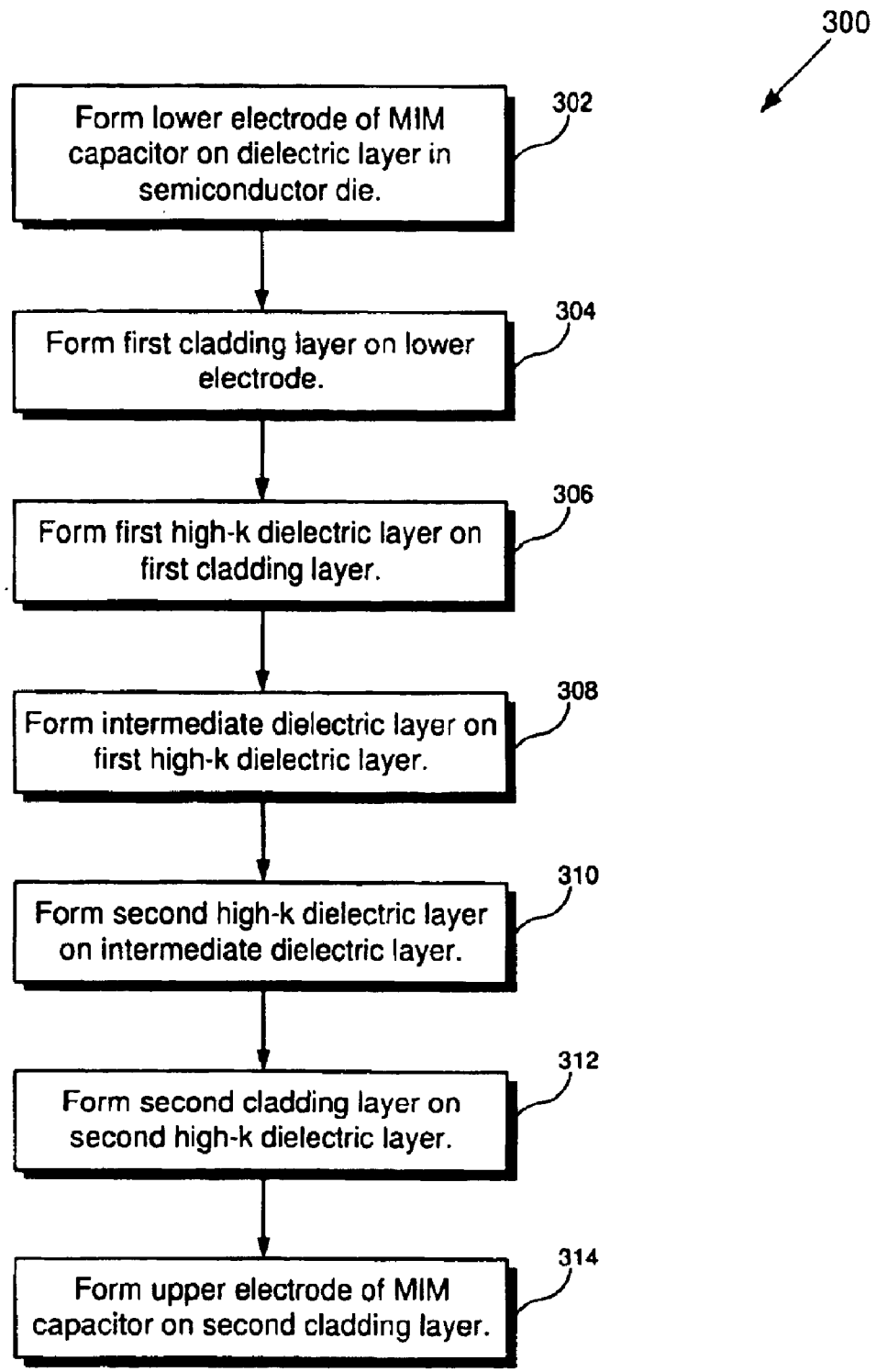
FIG. 3 shows a flowchart illustrating an exemplary method for fabricating an exemplary MIM capacitor according to one embodiment of the present invention.

FIG. 3 shows a flowchart illustrating an exemplary method according to one embodiment of the present invention. Certain details and features have been left out of flowchart 300 that are apparent to a person of ordinary skill in the art. For example, a step may consist of one or more substeps or may involve specialized equipment or materials, as known in the art. At step 302, metal plate 208, which forms a lower electrode of MIM capacitor 202, is formed on dielectric layer 204, which is situated in a semiconductor die (not shown in any of the figures). For example, metal plate 208 can be formed by depositing a layer of metal or metal compound, such as Tif/iN, on dielectric layer 204 in a manner known in the art.

At step 304, cladding layer 212 is formed on metal plate 208, i.e. a lower electrode of MIM capacitor 202. For example, cladding layer 212 can be formed by depositing a layer of $Al_2O_3$ on metal plate 208 using a MBE process or an ALD process or other processes. At step 306, high-k dielectric layer 216 is formed on cladding layer 212. For example, high-k dielectric layer 216 can be formed by depositing a layer of high-k dielectric, such as $HfO_2$, on cladding layer 212 using a MBE process or an ALD process or other processes. At step 308, intermediate dielectric layer 220 is formed on high-k dielectric layer 216. For example, intermediate dielectric layer 220 can be formed by depositing layer of $Al_2O_3$ on high-k dielectric layer 216 using a MBE process or an ALD process or other processes.

At step 310, high-k dielectric layer 218 is formed on intermediate dielectric layer 220. For example, high-k dielectric layer 218 can be formed be depositing a layer of high-k dielectric, such as $HfO_2$, on cladding layer 212 using a MBE process or an ALD process or other processes. At step 312, cladding layer 214 is formed on high-k dielectric layer 218. For example, cladding layer 214 can be formed by depositing a layer of $Al_2O_3$ on high-k dielectric layer 218 using a MBE process or an ALD process or other processes. At step 314, metal plate 210, which forms an upper electrode of MIM capacitor 202, is formed on cladding layer 214. For example, metal plate 210 can be formed by depositing a layer of metal or metal compound, such as TiN, on cladding layer 214 in a manner known in the art. All layers can be patterned, for example in two steps, after deposition of final metal 210 in a manner known in the art.

In other embodiments, the invention's high-k dielectric stack can include cladding layers that are separated by a number of alternating high-k dielectric and intermediate dielectric layers. For example, high-k dielectric layer 216 and/or high-k dielectric layer 218 can be separated by an intermediate dielectric layer, such as intermediate dielectric layer 220. The process of splitting a high-k dielectric layer into two high-k dielectric layers and forming an intermediate dielectric layer between the two high-k dielectric layers can be continued to create as many alternating high-k dielectric and intermediate dielectric layers as desired.

Thus, as discussed above, by forming a MIM capacitor having a high-k dielectric stack including an intermediate dielectric layer situated between two high-k dielectric layers, the present invention advantageously achieves a high-k dielectric stack having decreased leakage current and increased breakdown voltage compared to a conventional dielectric stack in a conventional MIM capacitor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, high-k dielectric stack in a MIM capacitor and method for its fabrication have been described.

What is claimed is:

1. A high-k dielectric stack situated between an upper electrode and a lower electrode of a MIM capacitor, said high-k dielectric stack comprising:

a first high-k dielectric layer, said first high-k dielectric layer having a first dielectric constant;

an intermediate dielectric layer situated on said first high-k dielectric layer, said intermediate dielectric layer having a second dielectric constant;

a second high-k dielectric layer situated on said intermediate dielectric layer, said second high-k dielectric layer having a third dielectric constant;

wherein said second dielectric constant is not greater than said first dielectric constant and said third dielectric constant;

wherein said intermediate dielectric layer forms an interface with each of said first high-k dielectric layer and said second high-k dielectric layer to impede electron flow between said upper and lower electrodes of said MIM capacitor.

2. The high-k dielectric stack of claim 1 further comprising first and second cladding layers, said first cladding layer being situated underneath said first high-k dielectric layer and said second cladding layer being situated on said second high-k dielectric layer.

3. The high-k dielectric stack of claim 1 wherein said second dielectric constant is less than said first dielectric constant and said third dielectric constant.

4. The high-k dielectric stack of claim 1 wherein said intermediate dielectric layer comprises $Al_2O_3$.

5. The high-k dielectric stack of claim 1 wherein said intermediate dielectric layer has a thickness between approximately 5.0 Angstroms and approximately 70.0 Angstroms.

6. The high-k dielectric stack of claim 2 wherein said first cladding layer is situated on said lower electrode and said upper electrode is situated on said second cladding layer.

7. The high-k dielectric stack of claim 6 wherein said lower electrode comprises Ti/TiN and wherein said upper electrode comprises TiN.

8. The high-k dielectric stack of claim 1 wherein said first and second high-k dielectric layers are selected from the group consisting of $HfO_2$ and $Ta_2O_5$.

9. A method for fabricating a MIM capacitor in a semiconductor die, said method comprising steps of:

forming a lower electrode of said MIM capacitor;

forming a first high-k dielectric layer over said lower electrode, said first high-k dielectric layer having a first dielectric constant;

forming an intermediate dielectric layer on said first high-k dielectric layer, said intermediate dielectric layer having a second dielectric constant;

forming a second high-k dielectric layer on said intermediate layer, said second high-k dielectric layer having a third dielectric constant;

forming an upper electrode of said MIM capacitor over said second high-k dielectric layer;

wherein said second dielectric constant is not greater than said first dielectric constant and said third dielectric constant;

wherein said intermediate dielectric layer forms an interface with each of said first high-k dielectric layer and said second high-k dielectric layer to impede electron flow between said upper and lower electrodes of said MIM capacitor.

10. The method of claim 9 further comprising the steps of:

forming a first cladding layer on said lower electrode before said step of forming said first high-k dielectric layer;

forming a second cladding layer on said second high-k dielectric layer after said step of forming said second high-k dielectric layer.

11. The method of claim 9 wherein said second dielectric constant is less than said first dielectric constant and said third dielectric constant.

12. The method of claim 9 wherein said intermediate dielectric layer comprises $Al_2O_3$.

13. The method of claim 9 wherein said intermediate dielectric layer has a thickness between approximately 5.0 Angstroms and approximately 70.0 Angstroms.

14. The method of claim 9 wherein said lower electrode comprises Ti/TiN and wherein said upper electrode comprises TiN.

15. The method of claim 9 wherein said first and second high-k dielectric layers are selected from the group consisting of $HfO_2$ and $Ta_2O_5$.

16. A MIM capacitor situated in a semiconductor die, said MIM capacitor comprising a lower electrode;

a first cladding layer situated on said lower electrode;

a first high-k dielectric layer situated on said first cladding layer, said first high-k dielectric layer having a first dielectric constant;

an intermediate dielectric layer situated on said first high-k dielectric layer, said intermediate dielectric layer having a second dielectric constant;

a second high-k dielectric layer situated on said intermediate dielectric layer, said second high-k dielectric layer having a third dielectric constant;

a second cladding layer situated on said second high-k dielectric layer:

an upper electrode situated on said second cladding layer;

wherein said intermediate dielectric layer forms an interface with each of said first high-k dielectric layer and said second high-k dielectric layer to impede electron flow between said upper and lower electrodes of said NM capacitor.

17. MIM capacitor of claim 16 wherein said second dielectric constant is less than said first dielectric constant and said third dielectric constant.

18. The MIM capacitor of claim 16 wherein said intermediate dielectric layer comprises $Al_2O_3$.

19. The MIM capacitor of claim 16 wherein said intermediate dielectric layer has a thickness between approximately 5.0 Angstroms and approximately 70.0 Angstroms.

20. The MIM capacitor of claim 16 wherein said lower electrode comprises Ti/TiN and wherein said upper electrode comprises TiN.

* * * * *